United States Patent
Yamamoto

(10) Patent No.: US 9,850,567 B2
(45) Date of Patent: Dec. 26, 2017

(54) HARD COATING AND TARGET FOR FORMING HARD COATING

(71) Applicant: Kobe Steel, Ltd., Kobe-shi (JP)

(72) Inventor: Kenji Yamamoto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 15/027,732

(22) PCT Filed: Nov. 17, 2014

(86) PCT No.: PCT/JP2014/080346
§ 371 (c)(1),
(2) Date: Apr. 7, 2016

(87) PCT Pub. No.: WO2015/076220
PCT Pub. Date: May 28, 2015

(65) Prior Publication Data
US 2016/0251748 A1    Sep. 1, 2016

(30) Foreign Application Priority Data

Nov. 21, 2013  (JP) ................. 2013-241066

(51) Int. Cl.
C09D 1/00    (2006.01)
C23C 14/06   (2006.01)
C23C 14/32   (2006.01)
C23C 14/34   (2006.01)
C23C 30/00   (2006.01)

(52) U.S. Cl.
CPC ............ C23C 14/0664 (2013.01); C09D 1/00 (2013.01); C23C 14/0641 (2013.01); C23C 14/325 (2013.01); C23C 14/3414 (2013.01); C23C 30/005 (2013.01)

(58) Field of Classification Search
None
See application file for complete search history.

(56) References Cited

U.S. PATENT DOCUMENTS

2003/0148145 A1  8/2003  Yamamoto et al.
2010/0047545 A1* 2/2010  Yamamoto ............ C23C 14/06
                                                          428/220

FOREIGN PATENT DOCUMENTS

| EP | 1 936 002 A1 | 6/2008 |
| JP | 10-309605 A | 11/1998 |
| JP | 2003-034859 A | 2/2003 |
| JP | 2009-203489 A | 9/2009 |
| JP | 2015-101736 A | 6/2015 |

OTHER PUBLICATIONS

Kobata et al, JP 2009-203489 English Abstract from PAJ.*
Kobata et al, JP 2009-203489 English Translation from PAJ.*
International Search Report and Written Opinion dated Feb. 24, 2015 for PCT/JP2014/080346 filed on Nov. 17, 2014.
Extended European Search Report dated May 29, 2017 in European Patent Application No. 14864258.0.

* cited by examiner

Primary Examiner — Colin W. Slifka
(74) Attorney, Agent, or Firm — Oblon, McClelland, Maier & Neustadt, L.L.P.

(57) ABSTRACT

Provided is a hard coating having, in particular, excellent oxidation resistance, high hardness, and excellent abrasion resistance as compared with conventional hard coatings such as TiSiN, TiAlSiN, TiCrAlSiN, and AlCrSiN coatings. The hard coating according to the present invention has a compositional formula of $(Ti_\alpha Cr_{1-\alpha})_{1-a} Ge_a (C_{1-x} N_x)$, where the atomic ratios of the elements satisfy the expressions: $0 \leq \alpha \leq 1$, $0.010 \leq a \leq 0.20$, and $0.5 \leq x \leq 1$.

8 Claims, No Drawings

HARD COATING AND TARGET FOR FORMING HARD COATING

TECHNICAL FIELD

The present invention relates to hard coatings and to targets for the formation of the hard coatings.

BACKGROUND ART

For better abrasion resistance of cutting tools including a hard metal, cermet, or a high-speed tool steel as a substrate, the substrate surface has been coated with a hard coating such as a TiN, TiCN, or TiAlN coating. As hard coatings having better properties, for example, Patent Literature 1 discloses a coating that is based on TiN or CrN and further contains Si so as to have better oxidation resistance. Patent Literature 2 discloses a coating that is based on TiAlN and further contains Si so as to have better oxidation resistance. Patent Literature 3 discloses a coating that is based on TiCrAlN and further contains Si so as to have better oxidation resistance.

Patent Literature 4 discloses a coating that is based on CrAlN and further contains Nb, Si, and B so as to have better oxidation resistance Patent Literature 5 discloses a hard coating that comprises a metallic compound containing at least one metallic element M and at least one non-metallic element X. The metallic element M is selected from the group consisting of Al, Ti, Zr, Hf, V, Nb, Ta, Cr, Mo, and W, and the non-metallic element X is selected from the group consisting of C, N, and O. Part of the metallic compound is substituted by at least one additional element L selected from the group consisting of Mn, Cu, Ni, Co, B, Si, S, Y, Ge, and Ga. Patent literature 5 fails to disclose the content of the added element L alone and fails to present an example using Ge, which is essentially used in the present invention.

As described above, various coatings have been proposed as hard coatings. However, with higher hardness of workpieces to be cut and higher cutting speeds, demands have been made to provide a mating having still better abrasion resistance.

CITATION LIST

Patent Literature

Patent Literature 1: Japanese Unexamined Patent Application Publication (JP-A) No. Hei07(1995)-300649
Patent Literature 2: JP-A Hei07(1995)-310174
Patent Literature 3: JP-A. 2003-034859
Patent Literature 4: PCT International Publication Number WO 2006/005217
Patent Literature 5: JP-A. 2009-203489

SUMMARY OF INVENTION

Technical Problem

The present invention has been made while focusing attention on these circumstances and has an object to provide a hard coating as follows, and a target for the formation of the hard coating. This hard coating particularly has excellent oxidation resistance and high hardness and consequently offers excellent abrasion resistance as compared with the conventional hard coatings such as TiSiN, TiAlSiN, TiCrAlSiN, and AlCrSiN coatings.

Solution to Problem

In an embodiment, the present invention, which can achieve the object, provides a hard coating having a compositional formula of $(Ti_\alpha Cr_{1-\alpha})_{1-a} Ge_a (C_{1-x} N_x)$. The atomic ratios $\alpha$, a, and x of elements meet conditions: $0 \leq \alpha \leq 1$, $0.010 \leq a \leq 0.20$, and $0.5 \leq x \leq 1$. The hard coating according to this embodiment is hereinafter also referred to as a "(Ti, Cr, Ge)(C, N) coating".

In another embodiment, the present invention, which can achieve the object, provides a hard coating having a compositional formula of $(Ti_\alpha Cr_{1-\alpha})_{1-a-b} Ge_a Si_b (C_{1-x} N_x)$. The atomic ratios $\alpha$, a, b, and x of elements meet conditions: $0 \leq \alpha \leq 1$, $0.010 \leq a \leq 0.20$, $b \leq 0.29$, $a+b \leq 0.30$, and $0.5 \leq x \leq 1$. The hard coating according to this embodiment is hereinafter also referred to as a "(Ti, Cr, Ge, Si)(C, N) coating".

In yet another embodiment, the present invention, which can achieve the object, provides a hard coating having a compositional formula of $(Ti_\alpha Cr_{1-\alpha})_{1-a-c} Ge_a Al_c (C_{1-x} N_x)$. The atomic ratios $\alpha$, a, c, and x of elements meet conditions: $0 \leq \alpha \leq 1$, $0.010 \leq a \leq 0.15$, $0.40 \leq c \leq 0.70$, and $0.5 \leq x \leq 1$. The hard coating warding to this embodiment is hereinafter also referred to as a "(Ti, Cr, Ge, Al)(C, N) coating".

In still another embodiment, the present invention, which can achieve the object, provides a hard coating having a compositional formula of $(Ti_\alpha Cr_{1-\alpha})_{1-a-b-c} Ge_a Si_b Al_c (C_{1-x} N_x)$. The atomic ratios $\alpha$, a, b, c, and x of elements meet conditions: $0 \leq \alpha \leq 1$, $0.010 \leq a \leq 0.10$, $b \leq 0.15$, $0.40 \leq c \leq 0.70$, and $0.5 \leq x \leq 1$. The hard coating according to this embodiment is hereinafter also referred to as a "(Ti, Cr, Ge, Si, Al)(C, N) coating".

The hard coatings may each contain at least one element M in an atomic ratio of 0.20 or less relative to all the metallic elements comprising Ti, Cr, the at least one element M, Ge, Si, and Al, where the at least one element M is selected from the group consisting of Group 4 elements excluding Ti; Group 5 elements; Group 6 elements excluding Cr; Sc; Y; B; and rare-earth elements, each specified in the periodic table.

In addition and advantageously, the present invention also includes a target for the formation of a hard coating. The target is used for the formation of any of the hard coatings. The target has such a chemical composition of elements excluding C and N as to correspond to any of the chemical compositions. The target is formed by powder metallurgy and has a relative density of 92% or more.

In the target for the formation of a hard coating, Ge in the chemical composition preferably forms a compound with, or is dissolved as a solute in, at least one element selected from the group consisting of Ti, Cr, Al, and Si in the chemical composition.

Advantageous Effects of Invention

The present invention provides hard coatings that particularly have excellent oxidation resistance and consequently offer excellent abrasion resistance, as compared with the conventional hard coatings such as TiSiN and TiAlSiN coatings. The hard coatings according to the present invention, when formed on the surface of a cutting tool or any other article, allow the cutting tool or any other article to have significantly better abrasion resistance. Examples of the cutting tool or any other article include, but are not limited to, cutting tools such as inserts, drills, and end mills; jigs and tools such as press forming tools, forging tools, and blanking punches; and machinery parts.

DESCRIPTION OF EMBODIMENTS

The inventor of the present invention made intensive investigations on elements to be added to the conventional hard coatings such as TiCrN coatings, so as to provide a hard coating that particularly has excellent oxidation resistance and consequently offers excellent abrasion resistance as compared with the conventional hard coatings. As a result, the inventor has found that a coating, when further containing Ge among various metallic elements, offers excellent oxidation resistance. This is because Ge in the coating is preferentially oxidized by frictional heat generated in a sliding environment typically under cutting and forms a protecting film to restrain oxidation progress. The hard coatings according to the embodiments of the present invention will be described below. The hard coatings contain Ge and offer particularly excellent oxidation resistance as described above.

$$(Ti_\alpha Cr_{1-\alpha})_{1-a}Ge_a(C_{1-x}N_x)$$

Initially, a coating corresponding to (Ti, Cr)(C, N) coating, except for further containing Ge will be illustrated. In particular, to allow Ge to form the protecting film and to thereby offer sufficient protective properties, the atomic ratio of Ge in the metallic elements (Ti, Cr, Ge), namely, the Ge content "a" is controlled to 0.010 or more. The Ge content "a" is more preferably controlled to 0.030 or more, and furthermore preferably 0.050 or more. In contrast, Ge is an element that affects amorphization of the coating and, if present in the coating in an excessively high content, tends to cause the coating to soften. To eliminate or minimize this, the Ge content "a" is controlled to 0.20 or less. and is preferably less than 0.15, and more preferably less than 0.10.

As is described above, the coating according to the present invention features the presence of Ge in a specific content. This configuration offers advantageous effects even when the base coating is any one of TiN, CrN, and TiCrN coatings. The atomic ratios (α and 1-α) of Ti and Cr in the hard coating may be any ones. Accordingly, the Ti atomic ratio α relative to the total of Ti and Cr is specified in the present invention as 0≤α≤1. The atomic ratio α is preferably 0.2 or more, and more preferably 0.5 or more, from the viewpoint of allowing the coating to surely have hardness.

The hard coating according to the embodiment of the present invention is based on a nitride, but part of nitrogen may be substituted by carbon. In this case, the coating may contain carbon within such a range that the carbon atomic ratio (1-x) relative to the total of carbon and nitrogen is less than 0.5, namely, within such a range that the nitrogen atomic ratio "x" meets the condition: 0.5≤x≤1.

$$(Ti_\alpha Cr_{1-\alpha})_{1-a-b}Ge_a Si_b(C_{1-x}N_x)$$

The base (Ti, Cr)(C, N) coating, when further containing Si in addition to Ge, has still better oxidation resistance due to the synergistic effect of Ge and Si, as compared with the base coating further containing Ge alone, i.e., the (Ti, Cr, Ge)(C, N) coating. To offer the advantageous effect sufficiently, the Si atomic ratio in the metallic elements (Ti, Cr, Ge, and Si), namely, the Si content "b" is preferably controlled to 0.01 or more, more preferably 0.05 or more, and furthermore preferably 0.10 or more. In contrast, the coating, if containing Si in an excessively high content, may undergo amorphization, as in the coating containing Ge in an excessively high content. To eliminate or minimize this, the Si content "b" is controlled to 0.29 or less, and preferably less than 0.20. The total content (a+b) of Ge and Si is controlled to 0.30 or less from the viewpoint of restraining the coating amorphization. The total content (a+b) of Ge and Si is preferably 0.25 or less.

The Ge atomic ratio in the metallic elements, namely, the Ge content "a" is controlled to 0.010 or more, as in the (Ti, Cr, Ge)(C, N) coating. The Ge content "a" is more preferably 0.030 or more, and furthermore preferably 0.050 or more. In contrast, Ge is an element that affects the coating amorphization and, if contained in an excessively high content, tends to cause the coating to soften, as described above. To eliminate or minimize this, the Ge content "a" is controlled to 0.20 or less. The Ge content "a" is preferably less than 0.15, and more preferably less than 0.10.

The atomic ratios (α and 1-α) of Ti and Cr in the hard coating may be any ones. Accordingly, the Ti atomic ratio α relative to the total of Ti and Cr is specified in the present invention as: 0≤α≤1. The atomic ratio α is preferably 0.2 or more, and more preferably 0.5 or more, from the viewpoint of allowing the coating to surely have certain hardness.

The hard coating according to this embodiment is also based on a nitride, but part of nitrogen may be substituted by carbon. In this case, the coating may contain carbon within such a range that the carbon atomic ratio (1-x) relative to the total of carbon and nitrogen is less than 0.5, namely, within such a range that the nitrogen atomic ratio "x" meets the condition: 0.5≤x≤1.

The inventor has found that a coating, when further containing Ge in a specific level or more, has better oxidation resistance, as is described above on the (Ti, Cr, Ge)(C, N) coating and the (Ti, Cr, Ge, Si)(C, N) coating. In addition, the inventor has also found that a coating, when further containing Si in addition to Ge, enjoys the synergistic effects of these elements and has particularly better coating properties including hardness, oxidation resistance, and abrasion resistance. These advantageous effects of Ge and of Ge in combination with Si are given also in a coating based on a (Ti, Cr, Al)(C, N) coating, as described below.

$$(Ti_\alpha Cr_{1-\alpha})_{1-a-c}Ge_a Al_c(C_{1-x}N_x)$$

Assume that a coating corresponding to the (Ti, Cr)(C, N) coating, except for further containing Al, namely, a (Ti, Al)(C, N) coating, a (Cr, Al)(C, N) coating, or a (Ti, Cr, Al)(C, N) coating is used as a base coating. Even in this case, the coating, when further containing Ge, can offer still better oxidation resistance as compared with the base coating such as the (Ti, Al)(C, N) coating. The operation and effects of this configuration are as in the (Ti, Cr, Ge)(C, N) coating.

To give the advantageous effects due to the addition of Ge, the Ge atomic ratio relative to the metallic elements (Ti, Cr, Ge, and Al), namely, the Ge content "a" is controlled to 0.010 or more. The Ge content "a" is more preferably 0.030 or more, and furthermore preferably 0.050 or more. In contrast, Ge is an element that causes the coating amorphization as described above. In addition, Al is also an element that affects the coating softening. The Ge content "a" in this coating is controlled to 0.15 or less, the upper limit of which is lower as compared with the upper limit of the Ge content (0.20) in the (Ti, Cr, Ge)(C, N) coating. The Ge content "a" is preferably less than 0.10.

The atomic ratios (α and 1-α) of Ti and Cr may be any ones as in the (Ti, Cr, Ge)(C, N) coating and the (Ti, Cr, Ge, Si)(C, N) coating. Accordingly, the Ti atomic ratio α relative to the total of Ti and Cr in the coating according to this embodiment of the present invention is specified as: 0≤α≤1. The atomic ratio α is preferably 0.2 or more, from the viewpoint of allowing the coating to surely have certain hardness.

The Al atomic ratio relative to the metallic elements, namely, the Al content "c" is controlled to 0.40 or more, and preferably 0.50 or more, and is controlled to 0.70 or less, and preferably 0.65 or less, from the viewpoint of allowing the coating to surely have high hardness and good oxidation resistance.

The hard coating according to this embodiment is also based on a nitride, but part of nitrogen may be substituted by carbon, as with the (Ti, Cr, Ge)(C, N) coating and the (Ti, Cr, Ge, Si)(C, coating. In this case, the coating may contain carbon within such a range that the carbon atomic ratio (1-x) relative to the total of carbon and nitrogen is less than 0.5, namely, within such a range that the nitrogen atomic ratio "x" meets the condition: 0.5≤x≤1.

$(Ti_\alpha Cr_{1-\alpha})_{1-a-b-c} Ge_a Si_b Al_c (C_{1-x} N_x)$

A coating based on the (Ti, Al)(C, N) coating, the (Cr, Al)(C, N) coating, or the (Ti, Cr, Al)(C, N) coating, when further containing Ge in combination with Si, offers still better oxidation resistance, as with the (Ti, Cr, Ge, Si)(C, N) coating. To offer the advantageous effect sufficiently, the Si atomic ratio relative to the metallic elements (Ti, Cr, Ge, Si, and Al), namely, the Si content "b" is preferably controlled to 0.01 or more. The Si content "b" is more preferably 0.03 or more. In contrast, the coating, if containing Si in an excessively high content, may suffer from amorphization, as in the coating containing Ge in an excessively high content. To eliminate or minimize this, the Si content "b" is controlled to 0.15 or less. The Si content "b" is preferably 0.10 or less. From the viewpoint of restraining the coating amorphization, the total content (a+b) of Ge and Si is preferably controlled to 0.20 or less, and is more preferably controlled to 0.15 or less.

The Ge atomic ratio relative to the metallic elements, namely, the Ge content "a" is controlled to 0.010 or more as with the (Ti, Cr, Ge, Al)(C, N) coating. The Ge content "a" is more preferably 0.030 or more, and furthermore preferably 0.050 or more. In contrast, Ge is an element that affects the coating amorphization, and Ge, if contained in an excessively high content, tends to cause the coating to soften, as described above. To eliminate or minimize this, the Ge content "a" is controlled to 0.10 or less, and is preferably controlled to 0.08 or less.

The atomic ratios (α and 1-α) of Ti and Cr in the hard coating may be any ones. Accordingly, the Ti atomic ratio α relative to the total of Ti and Cr is specified in the present invention as: 0≤α≤1. The atomic ratio α is preferably 0.2 or more from the viewpoint of allowing the coating to surely have certain hardness.

The Al atomic ratio relative to the metallic elements, namely, the Al content "c" is 0.40 or more, and preferably 0.50 or more and is 0.70 or less, and preferably 0.65 or less, from the viewpoint of allowing the coating to surely have high hardness and good oxidation resistance.

The hard coating according to the embodiment of the present invention is based on a nitride, but part of nitrogen may be substituted by carbon. In this case, the coating may contain carbon within such a range that the carbon atomic ratio (1-x) relative to the total of carbon and nitrogen is less than 0.5, namely, within such a range that the nitrogen atomic ratio "x" meets the condition: 0.5≤x≤1.

Any of the (Ti, Cr, Ge)(C, N) coating, the (Ti, Cr, Ge, Si)(C, N) coating, the (Ti, Cr, Ge, Al)(C, N) coating, and the (Ti, Cr, Ge, Si, Al)(C, N) coating may contain at least one element M in an atomic ratio of 0.20 or less relative to all the metallic elements comprising Ti, Cr, the at least one element M, Ge, Si, and Al, where the element M refers to an element selected from the group consisting of Group 4 elements excluding Ti; Group 5 elements; Group 6 elements excluding Cr; Sc; Y; B; and rare-earth elements, each specified in the periodic table. The element M contributes to higher hardness and higher oxidation resistance. To offer the advantageous effect, the atomic ratio of the element M can be typically 0.03 or more, and more preferably 0.05 or more. The rare-earth elements are exemplified by lanthanoid elements, namely, fifteen elements from La with the atomic number 57 to Lu with the atomic number 71 in the periodic table.

The hard coatings according to the present invention preferably have a thickness of from 0.5 μm to 20 μm. The hard coatings, if having a thickness of less than 0.5 μm, may difficulty offer sufficient excellent abrasion resistance. This is caused by the excessively small thickness. In contrast, the hard coatings, if having a thickness of greater than 20 μm, may have a deficit and/or undergo peeling during cutting. The coatings more preferably have a thickness of from 1 μm to 10 μm.

Effective techniques for producing the hard coatings according to the present invention include ion plating techniques such as arc ion plating (AIP); and reactive physical vapor deposition (reactive PVD) such as sputtering. In these techniques, a target is used as a solid source for evaporation, is evaporated or ionized, and then deposited in a gas containing nitrogen and/or a hydrocarbon on a substrate to be treated.

The deposition may be performed typically under conditions as follows.

Total pressure; 0.5 Pa to 4 Pa in AIP,
0.05 Pa to 1 Pa in sputtering
Bias voltage applied to the substrate upon deposition: 20 to 200 V (negative potential with respect to the ground potential)

Substrate temperature upon deposition: 300° C. to 800° C.

The target used to form any of the hard coatings is controlled to have a relative density of 92% or more so as to surely undergo stable discharge in a vacuum upon deposition and to give a hard coating having low surface roughness. The target, if having a relative density less than 92%, emits a larger amount of particles to form a hard coating having high surface roughness. Undesirably, the hard coating having high surface roughness has low hardness and fails to offer high abrasion resistance. The relative density is preferably 95% or more, and more preferably 99% or more.

The target according to the present invention is a multicomponent system and is difficult to be produced by a solution process. The target according to the present invention can be formed by powder metallurgy, in which material powders are mixed. In the target production process, a technique such as forging or hot isostatic pressing (HIP) is performed to cause the target to have a higher relative density to thereby have a relative density at the specific level or more.

Germanium (Ge) constituting the target is an element that is susceptible to oxidation. Accordingly, a Ge-containing material for use in the production of the target is typically preferably a compound of Ge in combination with at least one element selected from the group consisting of the other elements to be contained in the target, i.e., Ti, Cr, Al, and Si. The use of this compound restrains contamination of impurities such as oxygen and easily gives a high-purity target. Ge in the resulting target may form a compound, in particular an intermetallic compound, with at least one of the elements such as Ti, or may be dissolved as a solute in at least one of the elements such as Ti. The term "dissolved as a solute" includes the case where Ge is alloyed with at least one of the elements such as Ti. The target, when used for the formation of hard coatings, can give hard coatings that have sufficiently low surface roughness and can offer excellent abrasion resistance.

The chemical composition of elements of the target to be used determines the chemical composition of elements excluding C and N of a coating to be formed. Thus, the target preferably has a chemical composition identical to the chemical composition of elements excluding C and N of the coating to be formed.

This application claims priority to Japanese Patent Application No. 2013-241066 filed Nov. 21, 2013, the entire contents of which are incorporated herein by reference.

EXAMPLES

The present invention will be illustrated in further detail with reference to several examples (experimental examples) below. It should be noted, however, that the examples are by no means intended to limit the scope of the invention; that various changes and modifications can naturally be made therein without deviating from the spirit and scope of the invention as described herein; and all such changes and modifications should be considered to be within the scope of the invention.

Experimental Example 1: Evaluation on (Ti, Cr, Ge)(C, N) Coatings and (Ti, Cr, Ge, Si)(C, N) Coatings Coatings were deposited by ALP. A target was mounted as an evaporation source. The target contained elements, excluding C and N, necessary for deposition. Namely, the target had a chemical composition of metallic elements to constitute an intended coating, i.e., the chemical composition of Ti, Cr, the at least one element M, Ge, and Si as given in Table 1. A substrate to be treated was mounted onto a support. The substrate was selected from a hard-metal insert; a hard-metal two-flute ball end mill having a diameter of 10 mm; and a platinum foil for oxidation testing, having a size of 30 mm long by 5 mm wide by 0.1 mm thick. After evacuating the chamber, the substrate was raised in temperature up to 500° C. with a heater disposed in the chamber, followed by cleaning of the substrate with Ar ions in an Ar atmosphere at a pressure of 0.6 Pa and a voltage of 500 V for a duration of 5 minutes. Thereafter nitrogen gas was introduced to a total internal pressure of the chamber of 4 Pa, arc discharge was performed to form a coating on the surface of the substrate, where the coating had a thickness of 3 μm and had a chemical composition given in Table 1, and yielded a series of test specimens. The blanks in coating chemical compositions in Table 1 indicate that elements in question were not added.

To form a coating containing carbon (C), methane gas was introduced into the deposition equipment at a ratio in flow rate of 5% to 50% by volume with respect to the nitrogen gas. During the deposition, a bias voltage of 20 to 100 V was applied so as to cause the substrate to have a negative potential with respect to the ground potential.

The coatings in the test specimens obtained in the above manner were examined to measure the chemical composition and the Vickers hardness and to evaluate the oxidation resistance and the abrasion resistance.

Coating Chemical Composition and Vickers Hardness Measurements

The test specimen including the hard-metal insert and the coating formed on the insert was used to examine the chemical composition and Vickers hardness of the coating. The chemical composition including C and N of the coating was measured with an electron probe microanalyser (SPMA). The Vickers hardness was measured with a micro Vickers hardness meter at a measuring load of 0.245 N for a measuring time of 15 seconds.

Oxidation Resistance Evaluation

The oxidation resistance was evaluated in an oxidation test. Specifically, the test specimen including the platinum foil and the coating formed on the foil was subjected to a mass measurement with temperature rise in dry air to plot a mass increase curve. From the mass increase curve, an oxidation onset temperature was determined. The oxidation resistance was evaluated based on the oxidation onset temperature. The mass measurement was performed at a rate of temperature rise of 4° C./min. up to 1200° C.

Abrasion Resistance Evaluation

The abrasion resistance was evaluated in a cutting test. Specifically, the test specimen including the hard-metal ball end mill and the coating formed on the ball end mill was used in the cutting test performed under conditions as follows. In the test, a length of cut until flank wear at the interface reached 100 μm was measured as a tool life. Based on the tool life, the abrasion resistance was evaluated.

Cutting Test Conditions in Experimental Example 1:
Workpiece: SKD61 (HRC55) in accordance with Japanese Industrial Standards (JIS)
Cutting speed: 500 m/min.
Feed per tooth: 0.06 mm/tooth
Depth of cut: 5 mm
Width of cut: 0.6 mm
Length of cut: length of cut until flank wear at the interface reaches 100 μm
Other conditions: down cut, dry cut, air blowing alone The results of these measurements and evaluations are given in Table 1.

TABLE 1

| | | Coating chemical composition | | | | | | | | | | | |
|---|---|---|---|---|---|---|---|---|---|---|---|---|---|
| | | Ti | Cr | Element M | | | | | | | | Oxidation | Tool |
| | | Atomic ratio to all metallic elements | Atomic ratio to all metallic elements | Species | Atomic ratio to all metallic elements | Ge (a) | Si (b) | Ge + Si (a + b) | C (1 − x) | N (x) | Hardness [GPa] | onset temperature [° C.] | life [m] |
| No. | α | | | | | | | | | | | | |
| 1 | 1 | 1 | | | | | | | | 1 | 18 | 500 | 10 |
| 2 | 0 | | 1 | | | | | | | 1 | 15 | 700 | 5 |
| 3 | 1 | 0.995 | | | | 0.005 | | | | 1 | 18 | 550 | 15 |
| 4 | 1 | 0.99 | | | | 0.01 | | | | 1 | 23 | 700 | 30 |
| 5 | 1 | 0.95 | | | | 0.05 | | | | 1 | 24 | 800 | 40 |

TABLE 1-continued

| | | Coating chemical composition | | | | | | | | | | | |
|---|---|---|---|---|---|---|---|---|---|---|---|---|---|
| | | Ti | Cr | Element M | | | | | | | | | |
| No. | α | Atomic ratio to all metallic elements | Atomic ratio to all metallic elements | Species | Atomic ratio to all metallic elements | Ge (a) | Si (b) | Ge + Si (a + b) | C (1 − x) | N (x) | Hardness [GPa] | Oxidation onset temperature [° C.] | Tool life [m] |
| 6 | 1 | 0.90 | | | | 0.10 | | | | 1 | 25 | 850 | 50 |
| 7 | 1 | 0.80 | | | | 0.20 | | | | 1 | 25 | 850 | 55 |
| 8 | 1 | 0.70 | | | | 0.30 | | | | 1 | 17 | 850 | 12 |
| 9 | 0.78 | 0.70 | 0.20 | | | 0.10 | | | | 1 | 24 | 800 | 40 |
| 10 | 0 | | 0.90 | | | 0.10 | | | | 1 | 22 | 900 | 25 |
| 11 | 1 | 0.90 | | | | 0.10 | | | 0.30 | 0.70 | 24 | 800 | 45 |
| 12 | 1 | 0.90 | | | | 0.10 | | | 0.60 | 0.40 | 18 | 600 | 14 |
| 13 | 1 | 0.80 | | Ta | 0.10 | 0.10 | | | | 1.00 | 26 | 870 | 50 |
| 14 | 1 | 0.94 | | | | 0.05 | 0.01 | 0.06 | | 1 | 24 | 820 | 70 |
| 15 | 1 | 0.85 | | | | 0.05 | 0.10 | 0.15 | | 1 | 28 | 950 | 100 |
| 16 | 1 | 0.75 | | | | 0.05 | 0.20 | 0.25 | | 1 | 28 | 970 | 120 |
| 17 | 1 | 0.65 | | | | 0.05 | 0.25 | 0.30 | | 1 | 27 | 970 | 110 |
| 18 | 1 | 0.55 | | | | 0.05 | 0.40 | 0.45 | | 1 | 18 | 950 | 17 |
| 19 | 1 | 0.65 | | Nb | 0.10 | 0.05 | 0.20 | 0.25 | | 1 | 29 | 980 | 85 |

Table 1 demonstrates as follows. The TiN coating of Sample No. 1 and the CrN coating of Sample No. 2 did not contain Ge and both had a low hardness. The TiN coating of Sample No. 1 also had a low oxidation onset temperature. Both the two samples had a short tool life and failed to surely offer excellent abrasion resistance.

Sample No. 3 contained Ge, but in an insufficient content, and had a slightly higher oxidation onset temperature and a slightly longer tool life as compared with Sample No. 1, but failed to surely have sufficient oxidation resistance and failed to offer excellent abrasion resistance.

Samples Nos. 4 to 7 are (Ti, Cr, Ge)(C, N) coatings containing Ge in contents within the specific range. These coatings had excellent oxidation resistance, namely, had high oxidation onset temperatures, successfully had a hardness reaching 20 GPa or more, and offered a long tool Me and excellent abrasion resistance. The data demonstrate that the Ge content is preferably 0.030 or more, more preferably 0.050 or more, and particularly preferably 0.10 or more so as to offer higher hardness and still better oxidation resistance and abrasion resistance.

In contrast, a sample, if containing Ge in an excessively high content "a" as with Sample No. 8, had good oxidation resistance, but contrarily offered low hardness and significantly low abrasion resistance.

Samples Nos. 4 to 7 contained, as metallic elements, Ti alone in addition to Ge. In contrast, Sample No. 9 contained, as metallic elements, Ti and Cr in addition to Ge, and Sample No. 10 contained, as metallic elements, Cr alone in addition to Ge. Even such samples containing, as metallic elements, one more other metallic elements in addition to Ge had high hardness and good oxidation resistance and offered excellent abrasion resistance, as with Samples Nos. 4 to 7. A comparison between Sample No. 9 and Sample No. 10 demonstrates that samples, when having a Ti content a in the total of Ti and Cr of 0.2 or more, and more preferably 0.5 or more, more readily surely have hardness at certain level and more readily surely offer excellent abrasion resistance.

Samples Nos. 11 and 12 are samples having different ratios between carbon and nitrogen. Sample No. 11, as being a carbonitride having a ratio between carbon and nitrogen within the specific range, offered excellent oxidation resistance and abrasion resistance, as with Sample No. 6, which is a nitride. In contrast, Sample No. 12, as having a ratio between carbon and nitrogen out of the specific range and having an excessively high carbon content, failed to surely have oxidation resistance and consequently failed to offer excellent abrasion resistance.

Sample No. 13 is a sample corresponding to a (Ti, Cr, Ge)(C, N) coating, except for further containing Ta, which serves as an element M. The data demonstrate that this sample also had high hardness and good oxidation resistance and offered excellent abrasion resistance.

Samples Nos. 14 to 18 are samples of (Ti, Cr, Ge, Si)(C, N) coatings having different Si contents. With reference to Sample No. 14, the presence of a merely slight amount of Si caused the sample to have sufficiently better abrasion resistance. With reference to Samples Nos. 15 to 17, the presence of Si in contents of 0.10 or more caused the samples to have an oxidation onset temperature of 950° C. or higher and a hardness of 25 GPa or more, successfully had a tool life of 100 m or more, and offered excellent abrasion resistance. In contrast, Sample No. 18 had an excessively high Si content and an excessively high total content of Ge and Si. Although having good oxidation resistance, this sample had low hardness contrarily, and consequently failed to offer excellent abrasion resistance.

Sample No. 19 is a sample corresponding to a (Ti, Cr, Ge, Si)(C, N) coating, except for further containing Nb, which serves as an element M. The data demonstrate that this sample also had high hardness and good oxidation resistance and offered excellent abrasion resistance.

Experimental Example 2: Evaluation on (Ti, Cr, Ge, Al)(C, N) Coatings and (Ti, Cr, Ge, Si, Al)(C, N) Coatings Test specimens were prepared by forming coatings having chemical compositions given in Table 2 under the conditions as in Experimental Example 1. The test specimens were subjected to measurements of the chemical compositions and Vickers hardness of the coatings, and to oxidation tests so as to evaluate the oxidation resistance, in procedures similar to Experimental Example 1. The test specimens were also subjected to cutting tests under conditions below, and a "length of cut until flank wear at the interface reaches 100 μm" was measured and defined as a tool life. Based on the tool life, the abrasion resistance of each sample was evaluated. In Table 2, blanks in the chemical compositions of elements in coatings indicate that elements in question was not added.

Cutting Test Conditions in Experimental Example 2
  Workpiece: SKD11 (HRC60) in accordance with JIS
  Cutting speed: 150 m/min.
  Feed per tooth: 0.04 mm/tooth
  Depth of cut: 4.5 mm
  Width of cut: 0.2 mm
  Length of cut: length of cut until flank wear at the interface reaches 100 μm
  Other conditions: down cut, dry cut, air blowing alone The results of these measurements and evaluations are given in Table 2.

oxidation resistance both at excellent levels. Sample No. 11 contained Al in an excessively high content, thereby had a low hardness and a short tool life, namely, offered poor abrasion resistance.

Sample No. 12 is a sample containing Cr instead of Ti, and Sample No. 13 is a sample containing both Ti and Cr. Both of these samples had high hardness and good oxidation resistance and offered excellent abrasion resistance.

Sample No. 14 is a sample corresponding to a (Ti, Cr, Ge, Al)(C, N) coating, except for further containing Ta as an element M. The addition of the element M caused the sample to have higher hardness and still better oxidation resistance, to successfully have a tool life of 50 m or more, and to offer excellent abrasion resistance

TABLE 2

| | | Coating chemical composition | | | | | | | | | | | |
|---|---|---|---|---|---|---|---|---|---|---|---|---|---|
| | Ti | Cr | Element M | | | | | | | | | | |
| No. | α | Atomic ratio to all metallic elements | Atomic ratio to all metallic elements | Species | Atomic ratio to all metallic elements | Ge (a) | Si (b) | Al (c) | C (1 − x) | N (x) | Hardness [GPa] | Oxidation onset temperature [° C.] | Tool life [m] |
| 1 | 1 | 0.50 | | | | | | 0.50 | 0 | 1 | 26 | 800 | 10 |
| 2 | 0 | | 0.40 | | | | | 0.60 | 0 | 1 | 28 | 850 | 15 |
| 3 | 1 | 0.89 | | | | 0.01 | | 0.10 | 0 | 1 | 30 | 950 | 21 |
| 4 | 1 | 0.45 | | | | 0.05 | | 0.50 | 0 | 1 | 31 | 950 | 25 |
| 5 | 1 | 0.40 | | | | 0.10 | | 0.50 | 0 | 1 | 33 | 1000 | 30 |
| 6 | 1 | 0.35 | | | | 0.15 | | 0.50 | 0 | 1 | 31 | 970 | 25 |
| 7 | 1 | 0.30 | | | | 0.20 | | 0.50 | 0 | 1 | 23 | 950 | 8 |
| 8 | 1 | 0.65 | | | | 0.05 | | 0.30 | 0 | 1 | 27 | 800 | 10 |
| 9 | 1 | 0.55 | | | | 0.05 | | 0.40 | 0 | 1 | 28 | 850 | 24 |
| 10 | 1 | 0.25 | | | | 0.05 | | 0.70 | 0 | 1 | 29 | 850 | 21 |
| 11 | 1 | 0.15 | | | | 0.05 | | 0.80 | 0 | 1 | 22 | 800 | 11 |
| 12 | 0 | | 0.45 | | | 0.10 | | 0.45 | 0 | 1 | 31 | 1050 | 35 |
| 13 | 0.43 | 0.15 | 0.20 | | | 0.05 | | 0.60 | 0 | 1 | 32 | 1100 | 45 |
| 14 | 0.50 | 0.15 | 0.15 | Ta | 0.10 | 0.05 | | 0.55 | 0 | 1 | 34 | 1100 | 55 |
| 15 | 1 | 0.39 | | | | 0.05 | 0.01 | 0.55 | 0 | 1 | 33 | 1000 | 55 |
| 16 | 1 | 0.35 | | | | 0.05 | 0.05 | 0.55 | 0 | 1 | 33 | 1100 | 75 |
| 17 | 1 | 0.30 | | | | 0.05 | 0.10 | 0.55 | 0 | 1 | 31 | 1100 | 80 |
| 18 | 1 | 0.25 | | | | 0.05 | 0.15 | 0.55 | 0 | 1 | 25 | 850 | 65 |
| 19 | 0.43 | 0.15 | 0.20 | | | 0.05 | 0.05 | 0.55 | 0 | 1 | 35 | 1200 | 80 |
| 20 | 0 | | 0.30 | | | 0.05 | 0.10 | 0.55 | 0 | 1 | 34 | 1200 | 85 |
| 21 | 0.60 | 0.15 | 0.10 | Ta | 0.10 | 0.05 | 0.05 | 0.55 | 0 | 1 | 37 | 1200 | 70 |
| 22 | 0.60 | 0.15 | 0.10 | W | 0.10 | 0.05 | 0.05 | 0.55 | 0 | 1 | 36 | 1150 | 75 |
| 23 | 0.60 | 0.15 | 0.10 | Y | 0.10 | 0.05 | 0.05 | 0.55 | 0 | 1 | 36 | 1250 | 65 |
| 24 | 0.50 | 0.15 | 0.15 | B | 0.05 | 0.05 | 0.05 | 0.55 | 0 | 1 | 35 | 1200 | 70 |
| 25 | 0.60 | 0.15 | 0.10 | Ni | 0.10 | 0.05 | 0.05 | 0.55 | 0 | 1 | 22 | 500 | 10 |
| 26 | 0.60 | 0.15 | 0.10 | B | 0.10 | 0.05 | 0.05 | 0.55 | 0 | 1 | 23 | 600 | 13 |
| 27 | 0.60 | 0.15 | 0.10 | Ga | 0.10 | 0.05 | 0.05 | 0.55 | 0 | 1 | 17 | 700 | 12 |

Table 2 demonstrates as follows. Samples Nos. 1 and 2 did not contain Ge and had a short tool life.

Samples Nos. 3 to 7 are samples of (Ti, Cr, Ge, Al)(C, N) coatings having different Ge contents. Sample No. 3 contained Ge in a content within the specific range, but contained Al in an insufficient content, and had a rather short tool life. Samples Nos. 4 to 6, as being (Ti, Cr, Ge, Al)(C, N) coatings having chemical compositions meeting the specific conditions, had high hardness and good oxidation resistance, and offered excellent abrasion resistance. Sample No. 7 contained Ge in an excessively high content, thereby had a rather low hardness and a significantly short tool life, and offered poor abrasion resistance.

Samples Nos. 8 to 11 are samples containing Ge in an identical content to each other, but containing Al in different contents. Sample No. 8 contained Al in an insufficient content and had a short tool life. Samples Nos. 9 and 10 contained Ge and Al in contents within the specific ranges and acted as hard coatings having abrasion resistance and Samples Nos. 15 to 20 are samples of (Ti, Cr, Ge, Si, Al)(C, N) coatings, which further contained Si. Among them, Samples Nos. 15 to 18 are samples containing Ge and Al both in predetermined contents, but containing Si in different contents. The data of Samples Nos. 15 to 18 demonstrate that the samples, as containing Si and Ge in contents within the specific ranges, had particularly excellent oxidation resistance and consequently offered still better abrasion resistance.

Sample No. 19 is a sample containing both Ti and Cr, and Sample No. 20 is a sample containing Cr instead of Ti. Both of these samples had a high oxidation onset temperature and excellent oxidation resistance and consequently offered excellent abrasion resistance.

Samples Nos. 21 to 24 are samples corresponding to (Ti, Cr, Ge, Si, Al)(C,N) coatings, except for further containing any one of Ta, W, Y, and B as an element M. The samples, as further containing the element M, had a still higher hardness of 35 GPa or more, had an oxidation onset temperature of 1150° C. or higher, successfully had a tool life of 65 m or more, and offered still better abrasion resistance.

Samples Nos. 4 and 5 in Table 2 are samples both containing Ge in a content of 0.05, of which Sample No. 4 did not further contain Si, and Sample No. 15 further contained Si. A comparison between the two samples demonstrate that (Ti, Cr, Al)(C, N) coatings, when further containing Ge alone, had excellent oxidation resistance and excellent abrasion resistance, but, when further containing Si in addition to Ge, had still better oxidation resistance and offered still better abrasion resistance.

Samples Nos. 25 to 27 are samples containing, instead of the element M, any one of Ni, B, and Ga as another element than the specific elements M. The data on these samples demonstrate that the samples, when further containing an element other than the specific elements M, each acted as a coating having a low harness and a significantly low oxidation onset temperature, had poor oxidation resistance, and consequently had a significantly short tool life, and offered poor abrasion resistance.

Experimental Example 3: Evaluation on Targets

There were prepared targets having chemical compositions of $Ti_{0.15}Cr_{0.20}Al_{0.50}Si_{0.10}Ge_{0.05}$ (where the numerical subscripts are proportions indicated by atomic ratios in all metallic elements), namely, targets having chemical compositions of elements excluding carbon and nitrogen, identical to the chemical compositions of hard coatings to be deposited. The targets were each prepared by powder metallurgy, in which a powder compact was prepared, and the powder compact was solidified and compacted by hot isostatic pressing (HIP). The target preparations were performed under different conditions, e.g., under different pressure upon HIP, and yielded targets having different relative densities. Targets Nos. 1 to 6 in Table 3 were prepared using, as a Ge source, metal Ge, namely, elementary germanium. Also in Table 3, Target No. 7 was prepared using, as a Ge source, a powder of an alloy between Ge and Si; and Target No. 8 was prepared using, as a Ge source, a metallic powder including Ge dissolved as a solute in Al and Ti. Thus-obtained targets Nos. 7 and 8 in Table 3 contained Ge as an alloy or a solute in a solid solution.

The relative density of each of the prepared targets was measured using Archimedes' Principle. Except using the targets, coatings of about 3 μm thick were formed on a mirror-finished hard metal under conditions on facilities and deposition similar to Experimental Example 1. The surface roughness of the formed coatings was measured in conformity to JIS. In this experimental example, values obtained by dividing the measurements by the thicknesses are defined as surface roughness and given in Table 3. The dividing was performed so as to eliminate the influence of the coating thickness. Results of these measurements are given in Table 3.

TABLE 3

| No. | Target relative density [%] | Coating surface roughness [μm] |
|---|---|---|
| 1 | 85 | Abnormal discharge |
| 2 | 90 | 0.05 |
| 3 | 92 | 0.02 |
| 4 | 95 | 0.02 |
| 5 | 99 | 0.015 |

TABLE 3-continued

| No. | Target relative density [%] | Coating surface roughness [μm] |
|---|---|---|
| 6 | 100 | 0.01 |
| 7 | 100 | 0.005 |
| 8 | 100 | 0.005 |

Table 3 demonstrates as follows. Sample No. 1 using a target having a considerably low relative density of 85% underwent abnormal discharge and failed to undergo stable film deposition. Sample No. 2 using a target having a relative density slightly lower than the lower limit of the specific range could undergo deposition, but gave a coating having a rough surface. In contrast, Samples Nos. 3 to 8 using targets having a relative density at the specific level or higher gave hard coatings having a small surface roughness. In particular, Samples No. 7 and No. 8 using targets containing Ge as an alloy or a solute in a solid solution gave hard coatings having a sufficiently small surface roughness.

The invention claimed is:

1. A hard coating having a compositional formula of $(Ti_\alpha Cr_{1-\alpha})_{1-a-b}Ge_a Si_b M_z(C_{1-x}N_x)$, an oxidation onset temperature of 950° C. or higher, and a hardness of 25 GPa or more;
    where M is at least one element selected from the group consisting of:
        Group 4 elements excluding Ti;
        Group 5 elements;
        Group 6 elements excluding Cr;
        Sc;
        Y;
        B; and
        rare-earth elements, each specified in the periodic table; and
    where the ratios $\alpha$, a, b, x, and z meet the following conditions:
        $0 \leq \alpha \leq 1$;
        $0.010 \leq a \leq 0.20$;
        $0.10 \leq b \leq 0.29$;
        $0.15 \leq (a+b) \leq 0.30$;
        $0.5 \leq x \leq 1$; and
        $0 \leq z \leq 0.20$ relative to all the elements comprising Ti, Cr, the at least one element M, Ge, and Si.

2. A hard coating according to claim 1, having a compositional formula of $(Ti_\alpha Cr_{1-\alpha})_{1-a-b}Ge_a Si_b(C_{1-x}N_x)$,
    the ratios $\alpha$, a, b, and x of elements meeting conditions:
        $0 \leq a \leq 1$;
        $0.010 \leq a \leq 0.20$;
        $0.10 \leq b \leq 0.29$;
        $0.15 \leq (a+b) \leq 0.30$; and
        $0.5 \leq x \leq 1$.

3. The hard coating according to claim 2, having a compositional formula of $(Ti_\alpha Cr_{1-\alpha})_{1-a-b}Ge_a Si_b(C_{1-x}N_x)$, where $0.10 \leq b \leq 0.25$.

4. The hard coating according to claim 3, having a compositional formula of $(Ti_\alpha Cr_{1-\alpha})_{1-a-b}Ge_a Si_b(C_{1-x}N_x)$, where $0.03 \leq a \leq 0.20$.

5. The hard coating according to claim 3, having a compositional formula of $(Ti_\alpha Cr_{1-\alpha})_{1-a-b}Ge_a Si_b(C_{1-x}N_x)$, where $0.05 \leq a \leq 0.20$.

6. The hard coating according to claim 1, having a compositional formula of $(Ti_\alpha Cr_{1-\alpha})_{1-a-b}Ge_a Si_b M_z(C_{1-x}N_x)$, where $0.10 \leq b \leq 0.25$.

7. The hard coating according to claim 6, having a compositional formula of $(Ti_\alpha Cr_{1-\alpha})_{1-a-b}Ge_a Si_b M_z(C_{1-x}N_x)$, where $0.03 \leq a \leq 0.20$.

8. The hard coating according to claim 6, having a compositional formula of $(Ti_\alpha Cr_{1-\alpha})_{1-a-b}Ge_a Si_b M_z(C_{1-x}N_x)$, where $0.05 \leq a \leq 0.20$.

* * * * *